United States Patent
Ohkuma

[19]
[11] Patent Number: 6,107,209
[45] Date of Patent: Aug. 22, 2000

[54] THROUGH HOLE FORMATION METHOD AND A SUBSTRATE PROVIDED WITH A THROUGH HOLE

[75] Inventor: Norio Ohkuma, Machida, Japan

[73] Assignee: Canon Kabushiki Kaisha, Tokyo, Japan

[21] Appl. No.: 09/098,326

[22] Filed: Jun. 17, 1998

[30] Foreign Application Priority Data

Jun. 20, 1997 [JP] Japan .................................. 9-164499

[51] Int. Cl.⁷ .................................................. H01L 21/20
[52] U.S. Cl. ........................ 438/733; 438/739; 438/745; 438/753
[58] Field of Search ................... 438/745, 753, 438/733, 739

[56] References Cited

U.S. PATENT DOCUMENTS

| | | | |
|---|---|---|---|
| 4,007,464 | 2/1977 | Bassous et al. | 346/75 |
| 4,007,484 | 2/1977 | Bassous et al. | 346/75 |
| 4,312,008 | 1/1982 | Taub et al. | 346/140 |
| 5,141,596 | 8/1992 | Hawkins et al. | 156/628 |

*Primary Examiner*—Benjamin L. Utech
*Assistant Examiner*—Charlotte A. Brown
*Attorney, Agent, or Firm*—Fitzpatrick Cella Harper & Scinto

[57] ABSTRACT

A method of Si anisotropic etching makes it possible to relax the restrictions imposed upon the processing configuration of an Si substrate provided with the <100> plane orientation. This Si anisotropic etching method can be preferably used for the formation of the ink supply opening of an ink jet head, for example. When an Si material (Si substrate) having the <100> crystal plane orientation is processed by this anisotropic etching method, it is arranged to give heat treatment to such Si material in advance before etching. Thus, the processed section can be obtained in a bent configuration formed by the two <111> planes of crystal plane orientation. Therefore, the etching initiation surface is made smaller than that needed for the conventional art even when the same width should be obtained for a penetrating process, hence making a chip smaller accordingly for the reduction of costs.

4 Claims, 2 Drawing Sheets

$\theta 1 \simeq 55°$ $\theta 2 \simeq 125°$

THROUGH HOLE FORMATION METHOD AND A SUBSTRATE PROVIDED WITH A THROUGH HOLE

BACKGROUND OF THE INVENTION

1. Field of the Invention

The present invention relates to a through hole formation method using the Si anisotropic etching which is useful for the formation of an acceleration sensor, the ink supply opening of an ink jet head, or the like, that may require the micromachining techniques.

2. Related Background Art

As one of the conventional micromachining techniques, there has been widely adopted the anisotropic etching using alkaline solution to process the Si substrate which is provided with the <100> crystal plane orientation. This etching utilizes the difference in the dissolving speeds into the alkaline solution in accordance with the plane orientations. More specifically, the etching is in progress in a mode that the plane <111> where the dissolving speed is extremely slow is left intact.

FIG. 5 is a cross-sectional view schematically showing the example of a processed section formed by the conventional Si anisotropic etching. In FIG. 5, a reference numeral 51 designates an Si substrate; 52, an etching mask; 53, a <100> plane; and 54, a <111> plane. As shown in FIG. 5, the <111> plane is angled at approximately 55° both to the plane orientations of the <100> plane 53. As a result, in accordance with the conventional Si anisotropic etching, it is required to provide a width of (X+2t/tan 55°) geometrically for the initiation surface of the object to be etched in order to obtain a width X of a desired penetration process if the Si substrate 51 having a thickness t should be processed penetratingly, for example. There is then a limit to the configuration that may be processed by the adoption of such conventional art, therefore the process is largely restricted. Also, when such anisotropic etching method is applied to forming the ink supply opening of an ink jet head, or the like, for example, this method tends to impede making the chip smaller or present hindrance to the post processing of a chip (such as in the die bonding) eventually.

SUMMARY OF THE INVENTION

The present invention is designed in consideration of the problems described above. It is an object of the invention to provide a through hole formation method using the Si anisotropic etching that relaxes the restrictions imposed upon the process configuration by the adoption of the Si anisotropic etching even for the plane having the <100> orientation, as well as to provide a substrate provided with such through hole thereon.

The inventor hereof has found that it is possible to bend the tapered configuration of the processed section of a through hole by giving heat treatment in advance before the anisotropic etching is performed on the Si substrate having the <100> plane orientation.

In order to achieve the objects described above, a through hole formation method of the present invention is to form a through hole by an anisotropic etching given to an Si material provided with the <100> crystal plane orientation. This method comprises the step of performing the anisotropic etching subsequent to giving heat treatment to the Si material at a temperature of 1,000° C. or more.

Also, with respect to a substrate which is provided with a through hole formed by giving an anisotropic etching to an Si material having the <100> crystal plane orientation thereon, it is arranged to bend the tapered configuration of the through hole in the section to be processed.

In accordance with the present invention, the <111> plane having an angle of approximately 55° to the <100> plane appears immediately after the etching has begun in the same manner as the conventional art, but with the etching being in progress, the <111> plane having an angle of approximately 125° to the <100> plane appears due to the fact that the etching is performed subsequent to having given heat treatment to the Si substrate in advance. Then, with the further progress thereof, it becomes possible to bend the tapered configuration of the processed section of the through hole. If it is possible to obtain a processed section in such configuration, the etching initiation surface may be made smaller than that needed for the conventional art even for the same width that should be obtained by a penetrating process. Hence, a chip can be made smaller accordingly. Strictly speaking, it is still unknown why the <111> plane having an angle of 125° appears if the heat treatment has been given to the Si substrate, but conceivably, it is based upon an action related to the oxygen contained in the Si substrate.

DETAILED DESCRIPTION OF THE PREFERRED EMBODIMENTS

Hereinafter, the description will be made of the preferred embodiments in accordance with the present invention.

At first, an Si substrate (an Si material in the form of a substrate) having the <100> plane orientation is prepared. For this Si substrate, it is possible to use various kinds of Si conventionally known. However, it is particularly preferable to use the one having its oxygen concentration of 10E17 ($10 \times 10^{17}$) (atoms/cm$^3$) or more. It is more preferable to use the one having the oxygen concentration of 12E17 (atoms/cm$^3$) or more.

Then, this Si substrate 1 is heated in advance before it is etched. The heating condition thereof should be made appropriately so that in the anisotropic etching process to follow, the <111> plane of approximately 125° appears with respect to the <100> plane, and that the tapered configuration of the processed section of the through hole should be bent lastly. The temperature of such heat treatment is preferably be 1,000° C. or more. More preferably, it is 1,100° C. to 1,300° C. The heating period depends on the temperature of the treatment, but preferably, the period is usually 60 minutes or more.

Figure 1A:
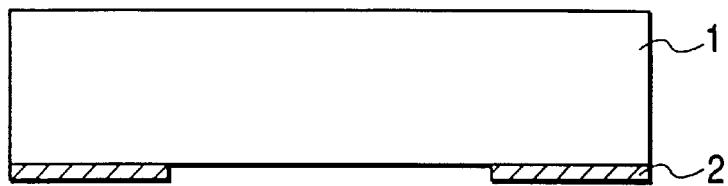
FIGS. 1A, 1B, 1C and 1D are cross-sectional views which schematically illustrate the anisotropic etching in accordance with the present invention, which is in progress as the time elapses.

After this heat treatment, the anisotropic etching is performed. FIGS. 1A to 1D are cross-sectional views schematically showing the anisotropic etching being in progress as the time elapses. At first, as shown in FIG. 1A, an etching mask 2, which is formed by a dielectric film ($SiO_2$, SiN) or the like having a desired pattern thereon, is formed on the reversed side of the Si substrate. Then, the anisotropic etching is performed using alkaline solution. As this alkaline solution, it is possible to use various kinds of alkaline solutions which are conventionally known. For example, water solution (concentration 22%) of tetramethyl ammonium hydro-oxide or the like can be used preferably. The temperature is preferably 60° C. to 100° C. at the time of etching.

Figure 1B:
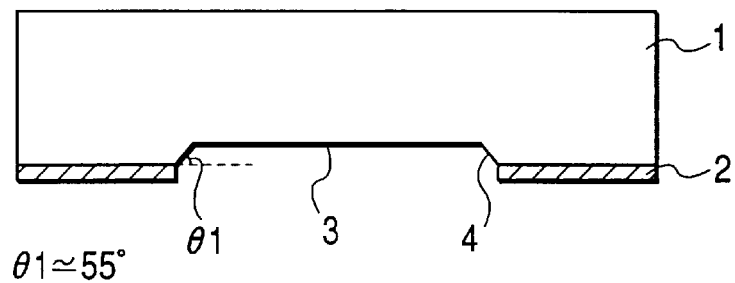
Figure 1C:
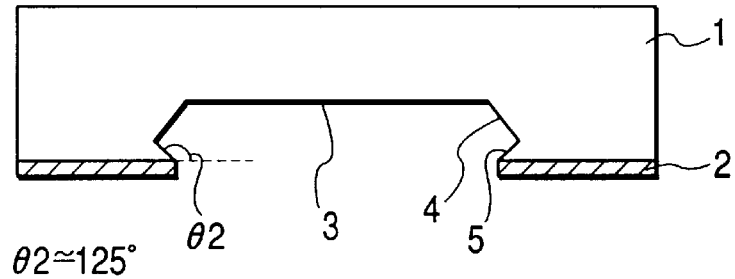
Figure 1D:
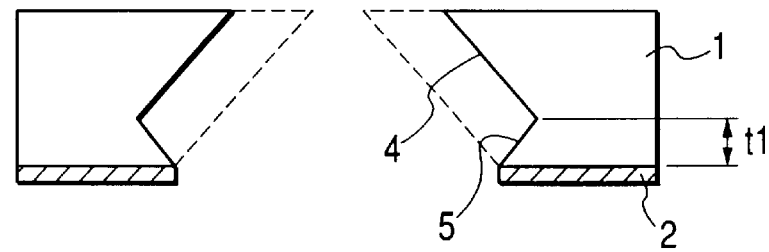

With the performance of this etching, the <111> plane 4 appears at first at an angle of approximately 55° ($\theta 1$) to the etching initiation plane (the <100> plane), as shown in FIG. 1B, immediately after the anisotropic etching has begun in the same way as the conventional art. Then, as shown in FIG. 1C, with the anisotropic etching being in progress, the <111> plane 5 appears at an angle of 125° ($\theta 2$) to the etching initiation plane 3. Lastly, as shown in FIG. 1D, the processed section is obtained in the bent configuration having a height t1 from the etching initiation plane to a portion where the <111> plane 4 and the <111> plane 5 intersect each other. Here, the dotted lines shown in FIG. 1D indicate the processed configuration (the conventional example) obtainable without giving any heat treatment to the Si substrate.

In accordance with the present invention, the processed section provided with the bent configuration is different from the one indicated by the dotted lines in FIG. 1D formed only by the inclined surfaces each having a fixed angle in the direction in which the processed width becomes narrower. Here, as indicated by the solid lines in FIG. 1D, the bent configuration means the one which is provided with the inclined surfaces (that is, the <111> plane 5 having a tapered angle of approximately 125°) each in the direction where the processed width becomes wider from the etching initial plane until it presents the desired height of t1, while the portions that exceed the height t1 are provided with the inclined surfaces (that is, the <111> plane 4 having a tapered angle of approximately 55°) each in the direction in which the processed width becomes narrower as in the conventional example.

Although it is still unknown why the <111> plane 5 appears at an angle of approximately 125° if the heat treatment is given, there is conceivably a close relationship between the appearance of this plane and the oxygen concentration in the Si substrate 1. In other words, in accordance with the findings made available for designing the present invention, this phenomenon becomes more conspicuous when the Si substrate used therefor has its oxygen concentration of 10E17 (atoms/$cm^3$) or more. Also, the height t1 shown in FIG. 1D changes in accordance with the changes in the heating temperatures of the heat treatment: the higher the heating temperature, the larger becomes the height at the t1.

Embodiments

Now, hereunder, the description will be made of the present invention more in detail in accordance with the embodiments thereof.

Embodiments 1 to 3, and the Comparative Example 1

Figure 2:
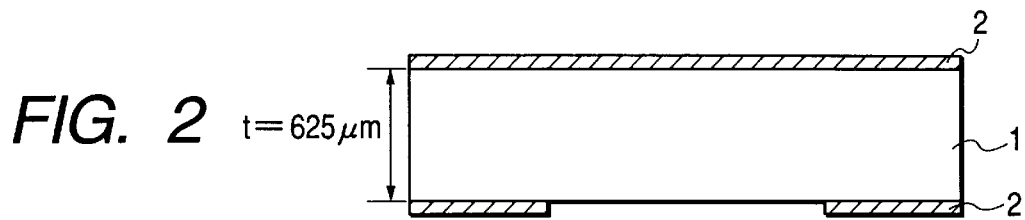
FIG. 2 is a cross-sectional view which shows one process of the etching schematically in accordance with a first embodiment to a third embodiment of the present invention.
Figure 3:
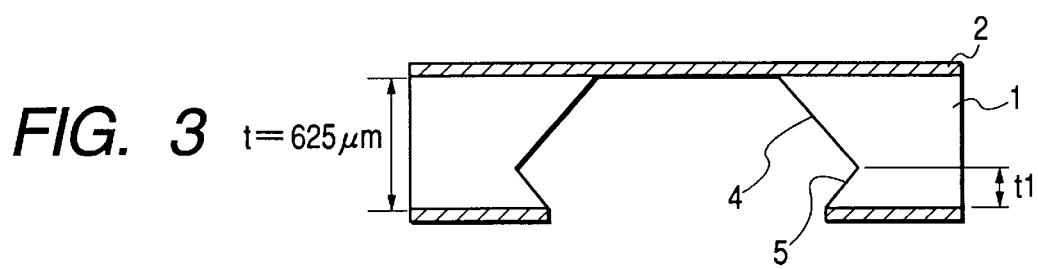
FIG. 3 is a cross-sectional view which shows one process of the etching schematically in accordance with the first embodiment to the third embodiment of the present invention.

At the temperatures shown in Table 1 given below, the respective heat treatments are given to the Si substrates each provided with the <100> plane orientation (in a thickness of 625 μm with the oxygen concentration of 14E17 atoms/$cm^3$). Then, as shown in FIG. 2, SiN film is formed using plasma CVD, and patterning is performed only on the reverse side thereof to produce an anisotropic etching mask 2. After that, the anisotropic etching is given to the respective Si substrates at 80° C. using water solution of TMAH (tetramethyl ammonium hydro-oxide) 22 wt % as alkaline etching solution. As a result, the processed section is formed in the Si substrate 1 as shown in FIG. 3 in a bent configuration having different <111> planes 4 and 5. In the Table 1 given below, there are listed the heights t1 from the etching initiation surface to the portions (bent portions) where the <111> plane 4 and the <111> plane 5 intersect each other in this processed section.

TABLE 1

|  | Heating condition | t1 |
| --- | --- | --- |
| Embodiment 1 | 1,000° C. | 10 μm |
| Embodiment 2 | 1,150° C. | 50 μm |
| Embodiment 3 | 1,250° C. | 80 μm |
| Comparative example 1 | none | 0 μm |

As understandable from the Table 1, it is possible to control the processed configuration by giving heat treatment to the Si substrate with an appropriately set heating temperature.

Embodiment 4

Figure 4:
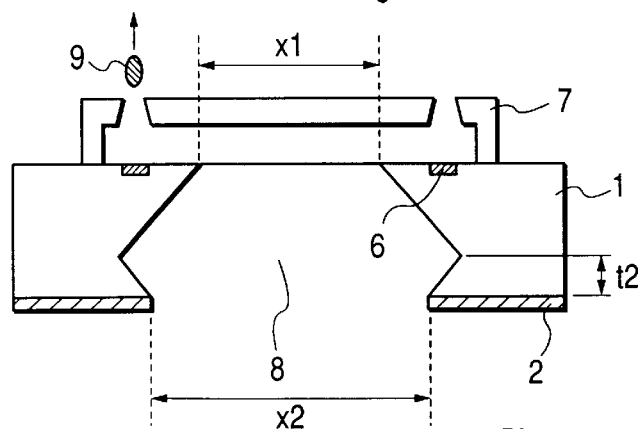
FIG. 4 is a cross-sectional view which shows a part of the ink jet head manufactured in accordance with a fourth embodiment of the present invention.
Figure 5:
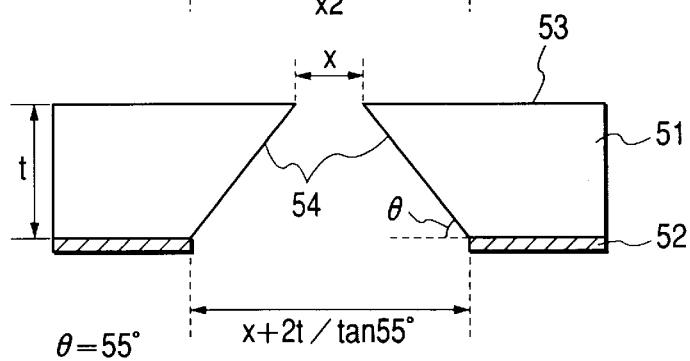
FIG. 5 is a cross-sectional view schematically showing the example of the processed section formed by the conventional Si anisotropic etching.

For the present embodiment, the Si anisotropic etching formation method of the present invention is utilized to form the ink supply opening of an ink jet head, which is exemplified as shown in FIG. 4.

On the Si substrate (thickness t: 625 μm; oxygen concentration: 14E17 atoms/$cm^3$) which is thermally treated at a temperature of 1,250° C. in advance, there are formed ink discharge energy generating devices 6, nozzles 7, and an anisotropic etching mask 2. Then, with the same anisotropic etching as used for the embodiments 1 to 3, an ink supply opening 8 is formed.

With this ink jet head, each of the ink droplets 9 is discharged in the direction indicated by an arrow in FIG. 4. For the present embodiment, the t2=80 μm, and the x1=140 μm. The dimension (x2) of the mask 2 is geometrically x2=x1+(625/tan 55°−80*2/tan 55°) Therefore, the x2=791 μm. In practice, however, the side etching of 100 μm takes place on one side when the anisotropic etching is performed. As a result, x2=791−100*2=591 μm for the present embodiment.

Now, on the other hand, if it is assumed that no heat treatment is given (as in the conventional example), the mask width x2 should be made equal to 815 μm (that is, 1,015 μm without any consideration given to the side etching) in order to make the x1=140 μm. In other words, with the heat treatment thus arranged for the present embodiment, the required width of opening on the reverse side is reduced by approximately 220 μm, hence making the chip smaller for the attainment of the cost reduction.

In this respect, it is possible to use without any particular restrictions the ink discharge energy generating devices 6, nozzles 7, and any other conventional members that may constitute an ink jet head when the ink jet head is manufactured in accordance with the present embodiment.

Now, in accordance with the present invention described above, the tapered configuration of the processed section of the through hole can be bent with the performance of the anisotropic etching on the Si substrate having the <100> plane orientation thereon. In this manner, it becomes possible to relax the restrictions imposed upon the configuration if it should be processed by the conventional art. Also, when this anisotropic etching method is utilized for the formation of the ink supply opening of an ink jet head, for example, the chip can be made smaller to reduce the costs accordingly.

What is claimed is:

1. A through hole formation method for forming a through hole through a Si material provided with the <100> crystal plane orientation, comprising the steps of:

heat treating said Si material at a temperature of 1,000° C. or more; and performing anisotropic etching to form, through said Si material, a through hole having a shape defined by at least one inner surface of said Si material, said inner surface having a notch therein.

2. A through hole formation method according to claim 1, wherein the oxygen concentration of said Si material is 10E17 (atoms/cm$^3$).

3. A through hole formation method according to claim 1, wherein said through hole is an ink supply opening of an ink jet head.

4. The method of claim 1, wherein the notch has portions disposed in respective planes of crystal plane orientation <111>.

* * * * *